United States Patent
Shiode

(10) Patent No.: US 9,921,470 B2
(45) Date of Patent: Mar. 20, 2018

(54) IMPRINT METHOD FOR AN IMPRINT APPARATUS WHICH TRANSFERS A PATTERN ONTO A SUBSTRATE BY USING A MOLD

(71) Applicant: CANON KABUSHIKI KAISHA, Tokyo (JP)

(72) Inventor: Yoshihiro Shiode, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 628 days.

(21) Appl. No.: 14/379,766

(22) PCT Filed: Feb. 13, 2013

(86) PCT No.: PCT/JP2013/054060
§ 371 (c)(1),
(2) Date: Aug. 20, 2014

(87) PCT Pub. No.: WO2013/136921
PCT Pub. Date: Sep. 19, 2013

(65) Prior Publication Data
US 2015/0021803 A1    Jan. 22, 2015

(30) Foreign Application Priority Data
Mar. 14, 2012    (JP) .................................. 2012-057876

(51) Int. Cl.
*G03F 7/00*    (2006.01)
*G03F 9/00*    (2006.01)
(Continued)

(52) U.S. Cl.
CPC .......... *G03F 7/0002* (2013.01); *B29C 59/002* (2013.01); *B29C 59/022* (2013.01);
(Continued)

(58) Field of Classification Search
None
See application file for complete search history.

(56) References Cited

U.S. PATENT DOCUMENTS 7,780,893 B2    8/2010    Sreenivasan et al.
7,794,222 B2 *  9/2010    Suehira .................. B82Y 10/00
                                                          264/293
(Continued)

FOREIGN PATENT DOCUMENTS

CN    101604124 A    12/2009
EP      1731963 A2    12/2006
(Continued)

OTHER PUBLICATIONS

Korean Office Action issued in counterpart Korean application 10-2014-7027897, dated Nov. 19, 2015.
(Continued)

*Primary Examiner* — Benjamin A Schiffman
(74) *Attorney, Agent, or Firm* — Rossi, Kimms & McDowell LLP

(57) ABSTRACT

The present invention provides an imprint apparatus which transfers a pattern onto a substrate by using a mold including a first surface with a pattern region where an unevenness pattern is formed, and a second surface opposite to the first surface, the mold including a first pattern group formed between the second surface and a surface of a convex portion in the unevenness pattern, or on the second surface, the apparatus comprising a second pattern group, a detection unit configured to detect a mark group formed by light having passed through the first pattern group and the second pattern group, and a calculation unit configured to calculate a position deviation between the first pattern group and the second pattern group from the mark group detected by the detection unit.

12 Claims, 8 Drawing Sheets

(51) Int. Cl.
  *B29C 59/00* (2006.01)
  *B29C 59/02* (2006.01)
(52) U.S. Cl.
  CPC ............ *G03F 9/708* (2013.01); *G03F 9/7073* (2013.01); *G03F 9/7084* (2013.01); *G03F 9/7088* (2013.01); *B29C 2059/023* (2013.01)

(56) References Cited

U.S. PATENT DOCUMENTS

| | | | |
|---|---|---|---|
| 8,749,761 | B2 | 6/2014 | Yamaguchi et al. |
| 2006/0279004 | A1 | 12/2006 | Suehira et al. |
| 2008/0073604 | A1 | 3/2008 | Suehira et al. |
| 2010/0073671 | A1* | 3/2010 | Chou .................. G03F 7/70633 356/237.4 |
| 2010/0304280 | A1 | 12/2010 | Hatano |
| 2011/0141489 | A1 | 6/2011 | Sato |
| 2011/0206852 | A1 | 8/2011 | Shiode |
| 2011/0272840 | A1 | 11/2011 | Suehira et al. |
| 2012/0073462 | A1* | 3/2012 | Imhof .................. G03F 7/0002 101/450.1 |

FOREIGN PATENT DOCUMENTS

| | | |
|---|---|---|
| JP | 2000-223391 A | 8/2000 |
| JP | 2007-140460 A | 6/2007 |
| JP | 2007-201499 A | 8/2007 |
| JP | 4185941 B2 | 11/2008 |
| JP | 2009532909 A | 9/2009 |
| JP | 2010-278041 A | 12/2010 |
| JP | 2011122946 A | 6/2011 |
| KR | 1020060096998 A | 9/2006 |
| KR | 20110097641 A | 8/2011 |

OTHER PUBLICATIONS

Extended European Search Report issued in EP13761347.7, dated Jul. 7, 2015.
Office Action issued in JP2012-057876, dated Dec. 11, 2015.
International Search Report for Corresponding PCT/JP2013/054060, dated Apr. 16, 2013.
Notification of Transmittal of the International Search Report and the Written Opinion of the International Searching Authority, or the Declaration, dated Apr. 16, 2013.
Office Action issued in Chinese Appln. No. 201380013368.5, dated Feb. 3, 2016. English translation provided.

* cited by examiner

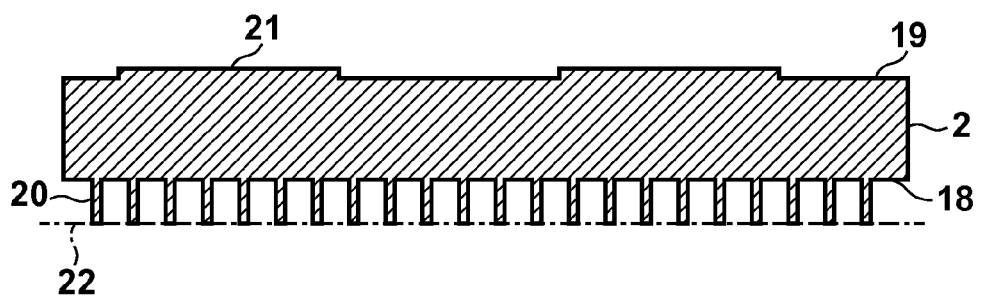
F I G. 2
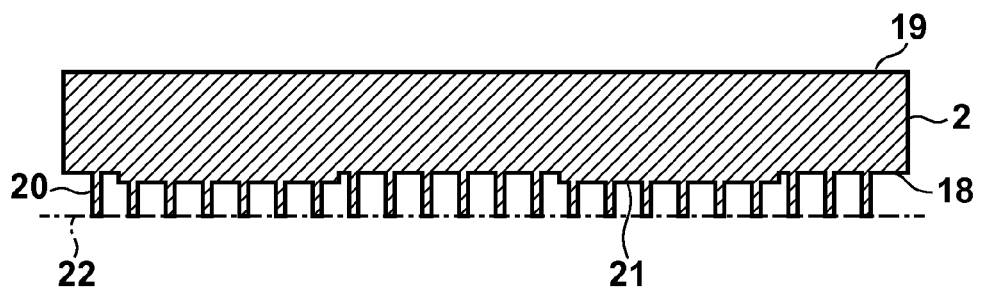
F I G. 3
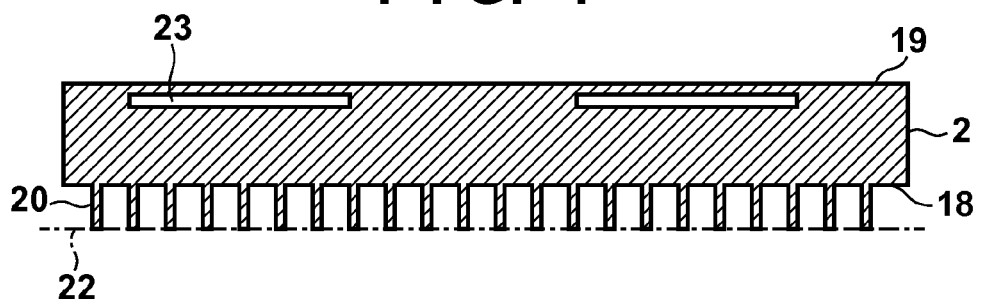
F I G. 4
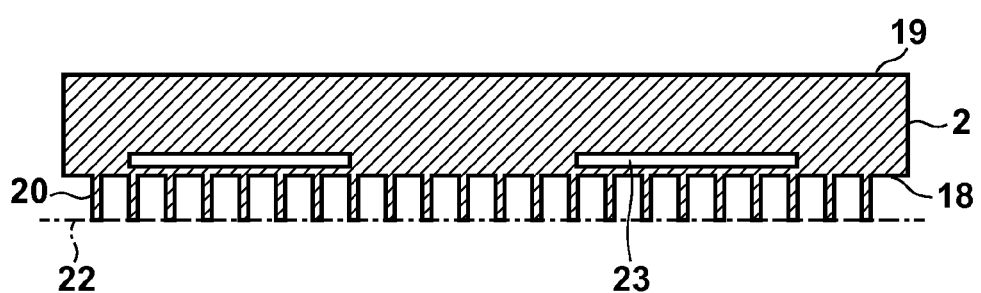
F I G. 5

US 9,921,470 B2

IMPRINT METHOD FOR AN IMPRINT APPARATUS WHICH TRANSFERS A PATTERN ONTO A SUBSTRATE BY USING A MOLD

TECHNICAL FIELD

The present invention relates to an imprint apparatus, a mold, an imprint method, and a method of manufacturing an article.

BACKGROUND ART

The imprint technique is attracting a great deal of attention as one of nano-lithography techniques for volume production of, for example, magnetic storage media and semiconductor devices. In the imprint technique, a pattern is transferred onto a substrate such as a silicon wafer or a glass plate using, as an original, a mold having a fine pattern formed on it.

An imprint apparatus which uses the imprint technique often adopts the die-by-die alignment method as an alignment method between a substrate and a mold. The die-by-die alignment method is an alignment method in which an alignment mark formed in each of a plurality of shot regions on the substrate is optically detected, and a deviation in positional relationship between the substrate and the mold is corrected. In such a method, a method of alignment using not only an alignment mark on a mold, which corresponds to an alignment mark on a substrate, but also a mark for obtaining the information of its position relative to the alignment mark has been proposed in Japanese Patent No. 4185941.

A mold used in an imprint apparatus generally has a rectangular pattern region (a region where a pattern is formed), and alignment marks are formed at the four corners of its peripheral portion surrounding the pattern region. An imprint apparatus aligns a substrate and a mold using an alignment mark formed on the peripheral portion surrounding the pattern region. However, when alignment is performed using the alignment mark formed on the peripheral portion surrounding the pattern region, it is often the case that the positional relationship between the substrate and the mold is correct on the peripheral portion but is incorrect in the pattern region. If, for example, nonlinear distortion has occurred in the mold (that is, if the distortions of the pattern region and peripheral portion of the mold are different from each other), a position deviation between the substrate and the mold occurs in the pattern region, resulting in an overlay error. Note that nonlinear distortion easily occurs in the mold upon deforming the mold or filling the pattern region of the mold with a resin.

SUMMARY OF INVENTION

The present invention provides a technique advantageous in terms of alignment between a substrate and a mold in an imprint apparatus.

According to one aspect of the present invention, there is provided an imprint apparatus which transfers a pattern onto a substrate by curing a resin on the substrate while a mold including a first surface with a pattern region where an unevenness pattern is formed, and a second surface opposite to the first surface is pressed against the resin, the mold including a first measurement pattern group formed between the second surface and a surface of a convex portion in the unevenness pattern, or on the second surface, the first measurement pattern group including a portion which falls within the pattern region, the apparatus comprising: a second measurement pattern group; a detection unit configured to detect a mark group formed by light having passed through the first measurement pattern group and the second measurement pattern group; and a calculation unit configured to calculate a position deviation between the first measurement pattern group and the second measurement pattern group from the mark group detected by the detection unit.

Further features of the present invention will become apparent from the following description of exemplary embodiments with reference to the attached drawings.

BRIEF DESCRIPTION OF DRAWINGS

FIG. 2 is a sectional view showing a mesa of a mold;

FIG. 3 is a sectional view showing another mesa of the mold;

FIG. 4 is a sectional view showing still another mesa of the mold;

FIG. 5 is a sectional view showing still another mesa of the mold;

DESCRIPTION OF EMBODIMENTS

Figure 1:
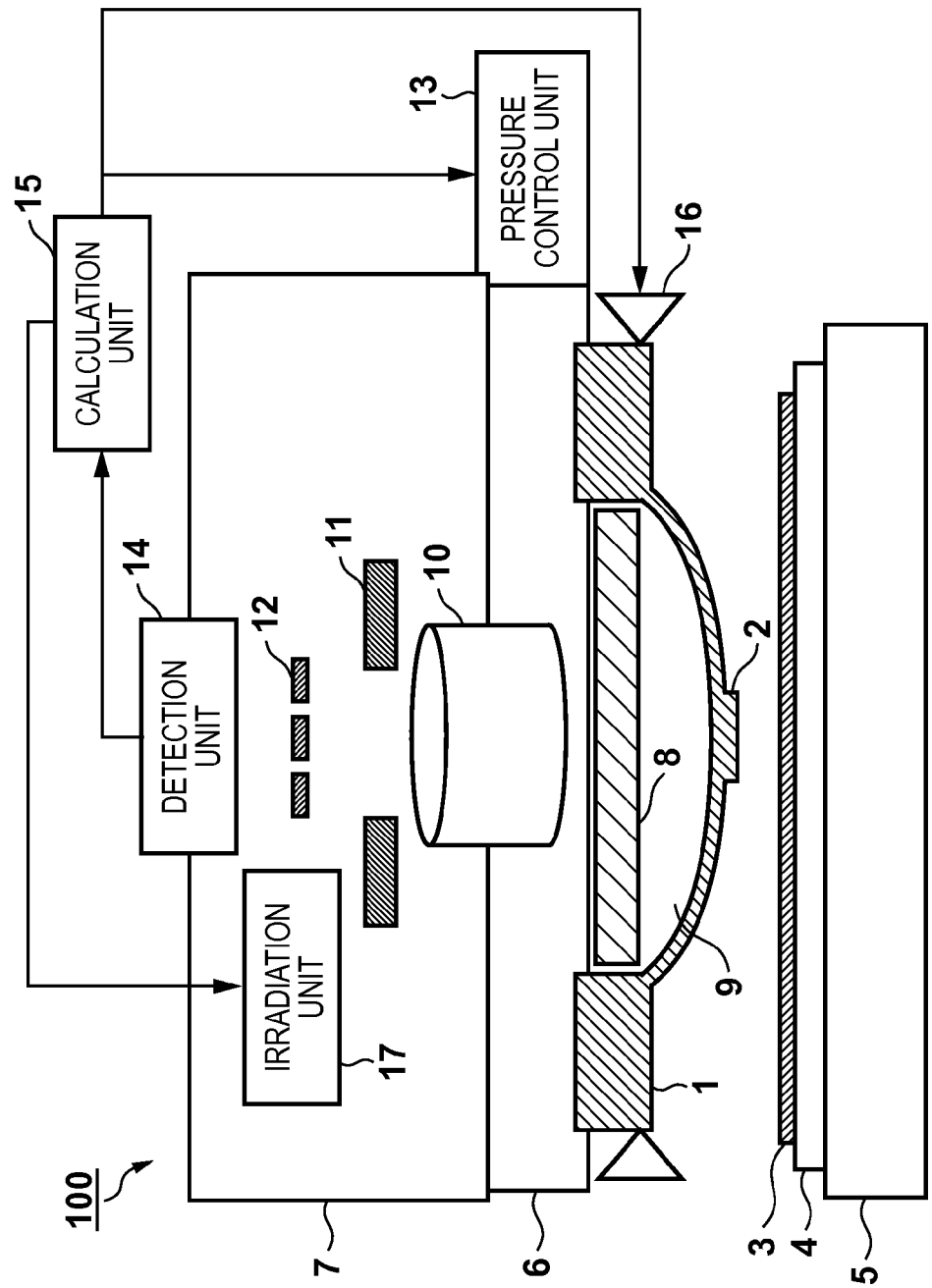
FIG. 1 is a view showing the configuration of an imprint apparatus according to the first embodiment of the present invention.

Exemplary embodiments of the present invention will be described below with reference to the accompanying drawings. Note that the same reference numerals denote the same members throughout the drawings, and a repetitive description thereof will not be given.

First Embodiment

An imprint apparatus 100 according to the first embodiment of the present invention will be described with reference to FIG. 1. The imprint apparatus 100 performs an imprint process of transferring a pattern onto a substrate by curing a resin on the substrate while a mold having a pattern region where an unevenness pattern is formed is pressed against the resin.

The imprint apparatus 100 includes a holding unit 6 which holds a mold 1, an imprint head 7, a substrate chuck 4, and a substrate stage 5. The imprint apparatus 100 also includes a pressure control unit 13, measuring unit 11, second measurement pattern group (second diffraction grating 12), detection unit 14, calculation unit 15, and deforming unit 16.

The mold 1 has a pattern surface, which partially includes a region called a mesa 2 on which an unevenness pattern to be transferred onto a substrate 3 is formed. The mesa 2 is formed using a step with a height of about several ten micrometers, and generally has a size of 33 mm×26 mm, although depending on the device pattern to be transferred. The mold 1 having the mesa 2 is held by the holding unit 6, and its surface opposite to its pattern surface is in contact with the holding surface of the holding unit 6. The holding unit 6 is attached to the imprint head 7, and is lifted or lowered by a drive source and a control mechanism (neither is shown) to bring the mold 1 close to the substrate 3 or separate the mold 1 from the substrate 3. The substrate 3 is held by the substrate stage 5, which is movable in the X- and Y-directions, through the substrate chuck 4.

The mold 1 is typically made of a quartz material, and has a concave portion formed in it by drilling its surface on the side of the holding surface so as to reduce the thickness of the pattern surface. The concave portion in the mold 1 forms an almost airtightly sealed space in cooperation with the holding surface of the holding unit 6. The space formed by the concave portion in the mold 1, and the holding surface of the holding unit 6, will be referred to as an air chamber 9 hereinafter. The air chamber 9 is connected to the pressure control unit 13 via a pipe. The pressure control unit 13 is implemented by a pressure controller including, for example, a servo valve and a switching valve for switching between a supply source which supplies compressed air to the air chamber 9 and that which evacuates the air chamber 9 to a vacuum. By controlling, by the pressure control unit 13, the pressure in the air chamber 9 at the time of an imprint process, the mold 1 can be deformed into a convex shape to bulge toward the substrate 3. In this manner, loss of the pattern transferred onto the substrate can be prevented by performing an imprint process upon deforming the mold 1.

The imprint apparatus 100 aligns the mold 1 and the substrate 3 in pressing the mold 1 against the resin on the substrate. Hence, the mesa 2 of the mold 1 has alignment marks 24 formed at the four corners of its peripheral portion surrounding a rectangular pattern region (a region where a pattern is formed). The imprint apparatus 100 includes the measuring unit 11 and deforming unit 16. The measuring unit 11 simultaneously observes the alignment marks 24 on the mesa 2 and the alignment marks on the substrate 3 to measure position deviations between these alignment marks. The deforming unit 16 applies a force to the mold 1 from the side to deform it, thereby correcting the position deviations between the alignment marks 24 on the mesa 2 and the alignment marks on the substrate 3, which are measured by the measuring unit 11. The deforming unit 16 uses, for example, an actuator such as a piezoelectric element, and can deform the mold 1 by applying a force to the mold 1 from the side while changing the amount of actuation of the actuator.

However, when alignment is performed using the alignment marks 24 formed on the peripheral portion surrounding the pattern region in the above-mentioned way, it is often the case that the positional relationship between the substrate 3 and the mold 1 is correct on the peripheral portion but is incorrect in the pattern region. If, for example, nonlinear distortion has occurred in the mold 1, a position deviation between the substrate 3 and the mold 1 occurs in the pattern region, resulting in an overlay error.

Hence, in the first embodiment, to decrease a position deviation between the substrate 3 and the mold 1 in the pattern region, the mesa 2 of the mold 1 includes a first measurement pattern group in the pattern region. The imprint apparatus 100 includes the second measurement pattern group (second diffraction grating 12), detection unit 14, calculation unit 15, and deforming unit 16. Note that in the first embodiment, diffraction gratings with staggered patterns are used as the first and second measurement pattern groups. In the following description, a first diffraction grating 21 exemplifies the first measurement pattern group, and the second diffraction grating 12 exemplifies the second measurement pattern group.

Figure 6:
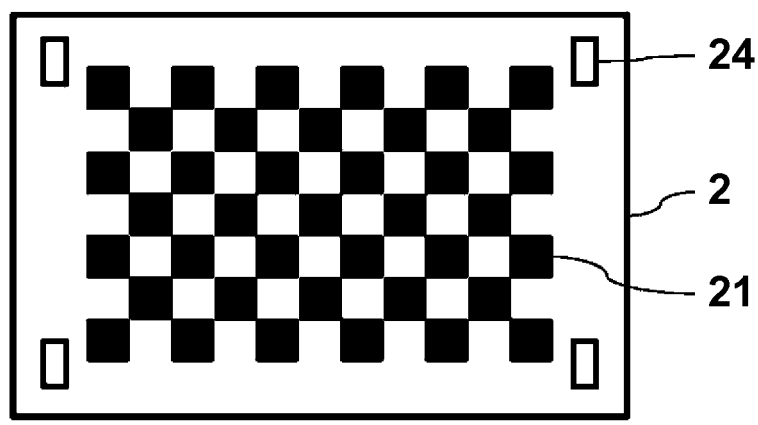
FIG. 6 is a view showing the grating pattern of a first diffraction grating on the mesa of the mold.

The mesa 2 of the mold 1 will be described with reference to FIG. 2. The mesa 2 has a first surface 18 with a pattern region where an unevenness pattern 20 is formed, and a second surface 19 opposite to the first surface 18. FIG. 2 is a sectional view showing the mesa 2. The mesa 2 has the unevenness pattern 20 which is formed on its first surface 18 and to be transferred onto the substrate 3, and the first diffraction grating 21 formed on its second surface 19 opposite to the first surface 18. The first diffraction grating 21 is formed so as to include a portion which falls within the pattern region (the region where the unevenness pattern 20 is formed), that is, in the region on the second surface 19, which corresponds to the pattern region on the first surface 18. Also, the first diffraction grating 21 is formed using a step with a height of about several ten nanometers, and has a staggered grating pattern, as shown in FIG. 6. The alignment marks 24 are arranged at the four corners of the peripheral portion of the first diffraction grating 21. Note that the grating pattern of the first diffraction grating 21 is not limited to a staggered pattern, and a measurement pattern group with a line-and-space pattern, a two-dimensional diffraction grating pattern, or a pattern other than diffraction grating patterns may be used. The grating pattern of the first diffraction grating 21 can be selected in accordance with the method used to observe a moire image formed by a combination of the first diffraction grating 21 and the second diffraction grating 12 in the imprint apparatus 100 (to be described later). Also, although the imprint apparatus 100 according to the first embodiment uses a moire image as interference fringes to be formed by a combination of the first diffraction grating 21 and the second diffraction grating 12, it may form other types of interference fringes. Furthermore, if no diffraction gratings are used for the first and second measurement pattern groups, a mark group formed by them may be used in place of interference fringes.

The first diffraction grating 21 can also be formed between the second surface 19 and a convex portion surface 22 in the unevenness pattern 20. For example, an imprint process is often performed by uniformly coating a resin on the substrate in advance by, for example, a spin coater, and pressing only the distal end of the unevenness pattern 20 of the mesa 2 against the uniformly coated resin. In this case, in pressing the unevenness pattern 20 of the mesa 2 against the resin on the substrate, the resin does not fill the first diffraction grating 21 due to a capillary force, so the first diffraction grating 21 may be formed on the first surface 18 on which the unevenness pattern 20 is formed, as shown in FIG. 3. Also, the first diffraction grating 21 may be formed by a metal film in place of a step, and an ion implantation layer 23 may be formed inside the mesa 2 by ion implantation, as shown in FIGS. 4 and 5. Although the unevenness pattern 20 and first diffraction grating 21 are formed on the mesa 2 of the mold 1 in the first embodiment, they may be directly formed on the mold 1 with no mesa 2.

In this manner, the mold 1 having the mesa 2 must be designed in consideration of the influence of unevenness of exposure, and the contrast of a moire image in detection when the resin on the substrate is exposed to light to cure it in an imprint process. As shown in FIGS. 2 and 3, when the first diffraction grating 21 is formed using a step, the same material is used for its entire structure, so the transmittance is uniform, but the phase difference varies due to the presence of the step. That is, as the step becomes higher, the phase difference becomes larger, so unevenness of exposure is more likely to occur. On the other hand, as the step becomes higher to the degree that the phase difference comes close to $\pi$, the contrast of a moire image in detection can be increased. A sufficient contrast of a moire image in detection can be obtained using a low step by forming an optical system 10 so as to receive no 0th-order light (to be described later). Hence, it is desired to form a low step to prevent the occurrence of unevenness of exposure. In the first embodiment, the step has a height of several ten nanometers, so the unevenness of exposure generated by it falls within the tolerance (about 10%) of unevenness of exposure in a normal imprint apparatus. Note that as shown in FIGS. 4 and 5, when the first diffraction grating 21 is formed inside the mesa 2 by the ion implantation layer 23, it is necessary to optimize the factors associated with the imprint process, based on the values of physical properties including the depth, refractive index, and absorption coefficient of the formed ion implantation layer 23.

The second diffraction grating 12 serves as a diffraction grating which has a grating pitch different from that of the first diffraction grating 21 and receives light having passed through the first diffraction grating 21, and is placed at a position optically conjugate to the first diffraction grating 21. Although the second diffraction grating 12 has a staggered grating pattern in the first embodiment, a measurement pattern group with a line-and-space pattern, a two-dimensional diffraction grating pattern, or a pattern other than diffraction grating patterns may be used, like the first diffraction grating 21. Also, the second diffraction grating 12 may be provided with sheet glass 8 in the air chamber 9, and formed on the lower surface of the sheet glass 8, as shown in FIG. 1. In this case, since the first diffraction grating 21 and second diffraction grating 12 can come close to each other, errors due to the aberrations of the optical system 10 and detection unit 14, for example, can be eliminated. However, when the distance between the first diffraction grating 21 and the second diffraction grating 12 becomes as large as about several hundred micrometers to one millimeter, the contrast degrades due to the influence of defocus.

A moire alignment method in which alignment is performed using a moire image formed by the first diffraction grating 21 and second diffraction grating 12 having different grating pitches will be described herein. The first diffraction grating 21 and second diffraction grating 12 have line-and-space grating patterns. Letting P1 be the grating pitch of the first diffraction grating 21, and P2 be the grating pitch of the second diffraction grating 12, a pitch P3 of moire fringes formed by the first diffraction grating 21 and second diffraction grating 12 is given by:

$$1/P3 = (1/P1) - (1/P2) \quad (1)$$

(for P1<P2)

Letting $\Delta X$ be the amount of relative position deviation between the first diffraction grating 21 and the second diffraction grating 12, the amount of shift of the pitch P3 of moire fringes is proportional to a phase difference corresponding to a period Pa. Also, when the relationship between the first diffraction grating 21 and the second diffraction grating 12 is reversed, the pitch P3 of moire fringes remains the same, but the direction of shift becomes opposite to the above case. Therefore, an amount of relative shift S of moire fringes formed by simultaneously observing diffraction gratings having different grating pitches is given by:

$$S = 2 \cdot (\Delta X / Pa) \cdot P3 \quad (2)$$

(for Pa=(P1+P2)/2)

By appropriately selecting the grating pitches P1 and P2 in equations (1) and (2), a relative position deviation between the first diffraction grating 21 and the second diffraction grating 12 can be increased and measured with high accuracy. In this manner, in the moire alignment method, the numerical aperture (NA) can be reduced by increasing the pitch P3 of moire fringes without increasing the optical magnification of the optical system, thus improving the alignment accuracy using a simple optical system.

The detection unit 14 includes, for example, a CCD or CMOS sensor, and detects a moire image formed by the first diffraction grating 21 and second diffraction grating 12. The detection unit 14 also includes an illumination unit (not shown), and is designed to use the optical system 10 to irradiate the entire surfaces of the second diffraction grating 12 and the first diffraction grating 21 of the mesa 2 with light. Light diffracted by the first diffraction grating 21 also passes through the second diffraction grating 12 to form a moire image.

Figure 7:
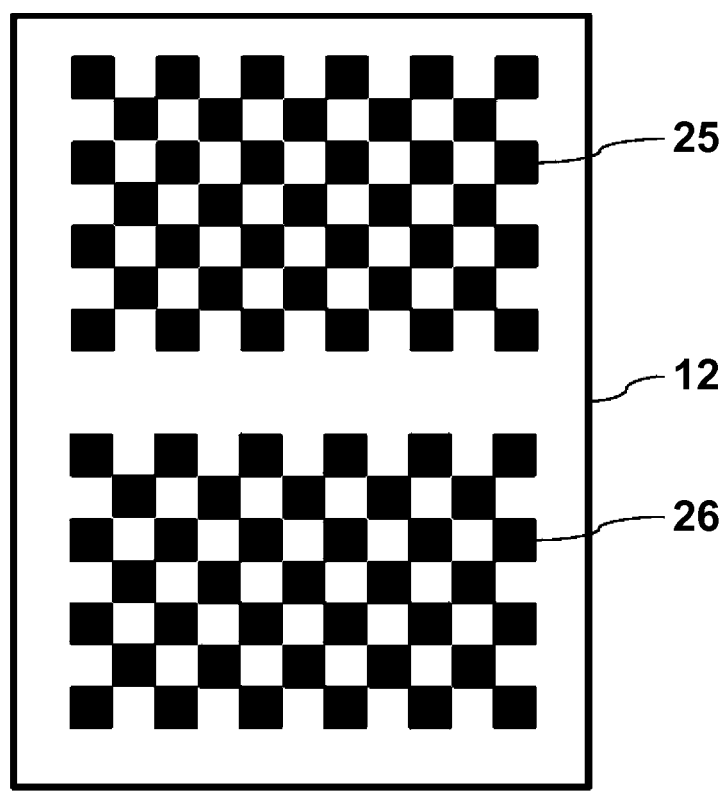
FIG. 7 is a view showing the grating pattern of a second diffraction grating in an imprint apparatus according to the first embodiment of the present invention.

As a method of irradiating the entire surfaces of the second diffraction grating 12 and the first diffraction grating 21 of the mesa 2 with light, vertical illumination or oblique illumination is available. A method of irradiation with light by vertical illumination will be described in the first embodiment. Staggered patterns are used as the grating patterns of the first diffraction grating 21 and second diffraction grating 12, and the first diffraction grating 21 has a grating pitch of 10 µm in both the X- and Y-directions. The second diffraction grating 12 may include a plurality of diffraction gratings with different grating pitches, and includes two types of diffraction gratings 25 and 26 in the first embodiment, as shown in FIG. 7. The diffraction grating 25 has a grating pitch of 10.03 µm in both the X- and Y-directions, while the diffraction grating 26 has a grating pitch of 9.97 µm in both the X- and Y-directions. In this manner, as the second diffraction grating 12 includes the two types of diffraction gratings 25 and 26, the accuracy of calculating a position deviation in the pattern region can be doubled.

Figure 8:
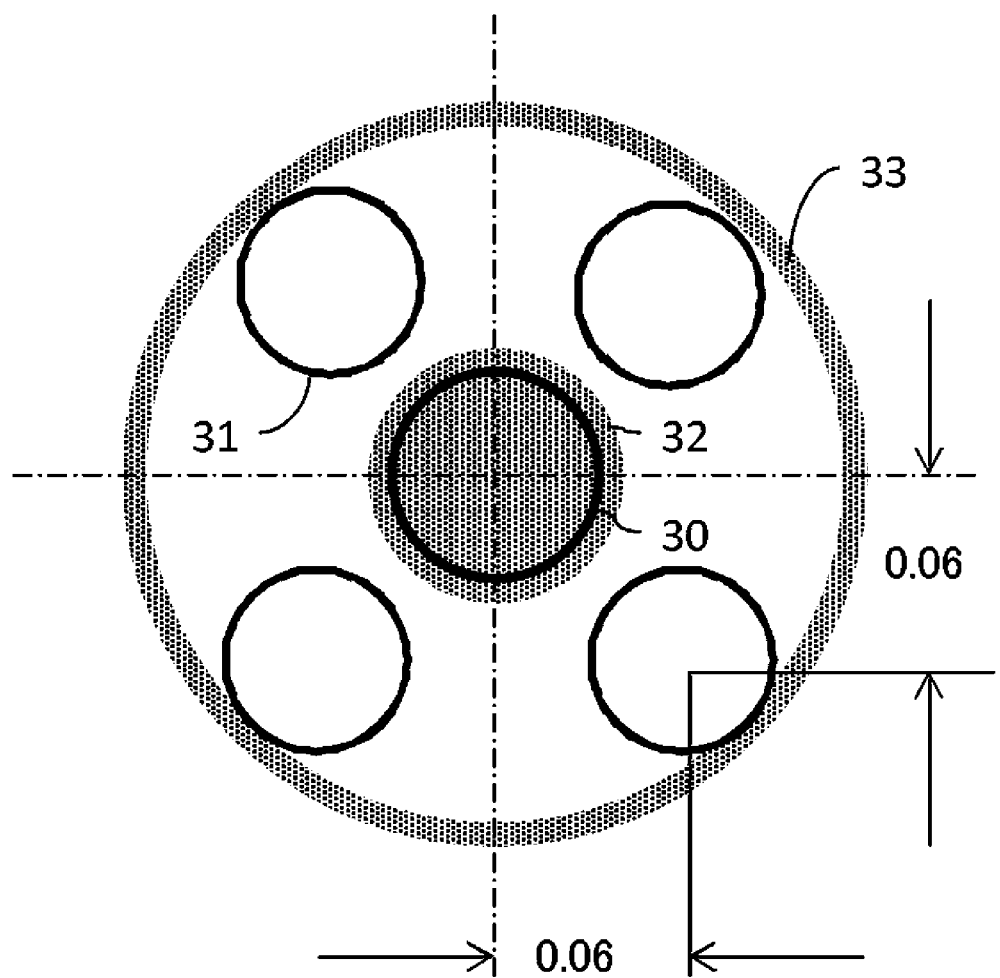
FIG. 8 is a view showing the light intensity distribution on the pupil plane of an optical system in the imprint apparatus according to the first embodiment of the present invention.

When the illumination wavelength is set to 0.6 µm, 1st-order diffracted light beams 31 are diffracted by the first diffraction grating 21 at an angle corresponding to a numerical aperture (NA)=0.06. FIG. 8 shows the light intensity distribution on the pupil plane of the optical system 10 at this time. A 0th-order diffracted light beam 30 is positioned at the central portion of the pupil plane of the optical system 10, while four 1st-order diffracted light beams 31 are positioned in 45° directions with respect to this central portion. Because the 0th-order diffracted light beam 30 has a very strong light intensity, the contrast of a moire image degrades as the moire image is detected by the 0th-order diffracted light beam 30. Hence, a filter 32 which blocks the 0th-order diffracted light beam 30 is placed at the central portion of the pupil plane of the optical system 10 to cut off the 0th-order diffracted light beam 30. Also, because diffracted light beams of orders higher than the 1st-order diffracted light beams 31 generate noise, they are also blocked and cut off by a stop 33 on the pupil plane of the optical system.

Each of the four 1st-order diffracted light beams 31 diffracted by the first diffraction grating 21 is further split into ±1st-order diffracted light beams (NA=0.1198 and NA=0.0002) upon passing through the second diffraction grating 12. Because diffracted light with NA=0.0002 is used to detect a moire image, diffracted light with NA=0.1198 can be cut off by setting the objective stop of the detection unit 14 to have NA=0.06 or less. In this manner, a moire image with a long two-dimensional period is formed by diffracted light with NA=0.0002, which has passed through the first diffraction grating 21 and second diffraction grating 12. Note that the period of the formed moire image is about 1.6 mm in both the X- and Y-directions, and this means that the amount of relative shift between the first diffraction grating 21 and the second diffraction grating 12 can be measured at 320×.

To detect a moire image with a higher accuracy, it is possible to increase the amount of light. To increase the amount of light, it is desired to set a low optical magnification, and use a light source with a high intensity. When a mesa 2 with a size of 33 mm×26 mm is used, a sensor with almost the same size and a high pixel resolution is commercially available, and can be used to resolve the moire image at nearly unity optical magnification. Also, a high-brightness light source such as an LED, a halogen lamp, or an SLD (Super Luminescent Diode) is commercially available as the light source.

The calculation unit 15 calculates a position deviation in the pattern region of the mesa 2 (mold 1) based on the moire image detected by the detection unit 14. It is often the case that nonlinear distortion has occurred in the pattern region of the mesa 2, as described above. Hence, it is desired to calculate, in advance, a position deviation in the pattern region of the mesa 2 based on the moire image obtained by detecting the mesa 2 in a reference state, and correct the position deviation at the time of an imprint process. The reference state of the mesa 2 means a state in which the pattern region of the mesa 2 is flat, and can be formed by, for example, pressing the mold 1 against a flat substrate 3 coated with no resin, or changing the pressure in the air chamber 9.

To reduce a position deviation in the pattern region of the mesa 2, the deforming unit 16 applies a force to the mold 1 to deform the pattern region of the mesa 2. The deforming unit 16 uses, for example, an actuator such as a piezoelectric element, and can deform the pattern region of the mesa 2 by applying a force to the mold 1 from the side while changing the amount of actuation of the actuator. Note that the pattern region of the mesa 2 can also be deformed by changing the pressure in the air chamber 9 by the pressure control unit 13, or changing the imprint force while lifting or lowering the imprint head 7, instead of an actuator. Also, the pattern region of the mesa 2 can be thermally deformed using an irradiation unit 17 to irradiate this pattern region with infrared rays.

In the first embodiment, a moire image is formed by the first diffraction grating 21 of the mesa (mold 1) and the second diffraction grating 12 of the imprint apparatus 100, and is detected by the detection unit 14. A position deviation in the pattern region of the mesa 2 is calculated from the detected moire image, and corrected by applying a force to the mold 1. This makes it possible to detect a position deviation in the pattern region of the mesa 2, which cannot be detected by the alignment marks 24 formed on the peripheral portion surrounding the pattern region, thereby correcting the distortion of the pattern region. That is, correcting the distortion of the pattern region makes it possible to decrease a position deviation between the substrate 3 and the mold 1 to reduce an overlay error. Note that more optimum alignment can be done when the above-mentioned correction operation is performed in combination with an alignment operation which uses the alignment marks 24 formed on the peripheral portion surrounding the pattern region. Also, high-accuracy alignment can be achieved even if the alignment marks 24 formed on the peripheral portion surrounding the pattern region are partially lost.

Second Embodiment

An imprint apparatus 200 according to the second embodiment of the present invention is different from the imprint apparatus 100 according to the first embodiment in terms of a method of irradiating the entire surfaces of a second diffraction grating 12 and a first diffraction grating 21 of a mesa 2 with light. A method of irradiation with light by oblique illumination will be described in the second embodiment. Also, the imprint apparatus 200 according to the second embodiment includes detection units 46 and 47 which split diffracted light into diffracted light beams along two optical paths in the X- and Y-directions, and detect the respective diffracted light beams.

Figure 9:
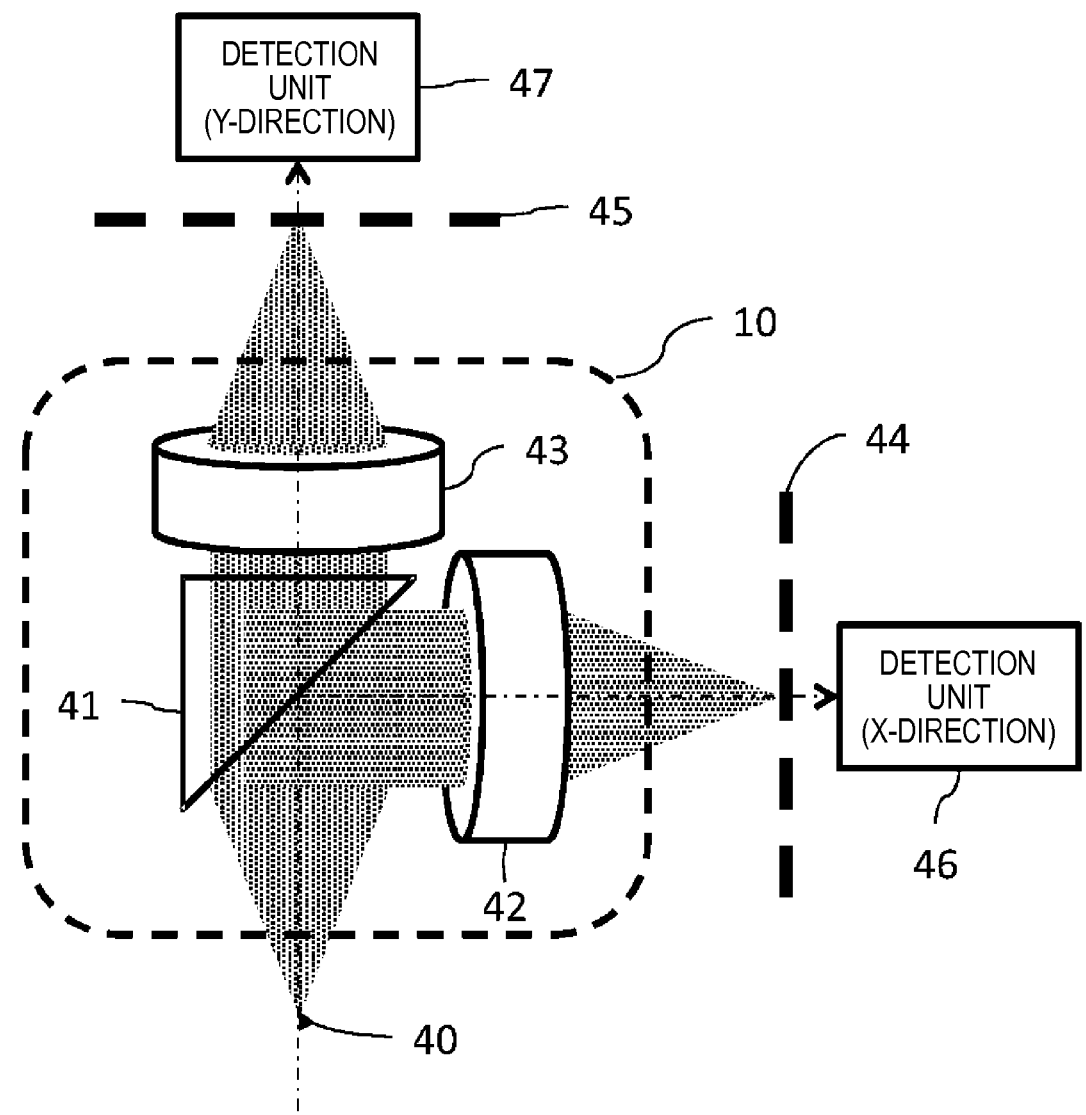
FIG. 9 is a schematic view showing an optical system in an imprint apparatus according to the second embodiment of the present invention.

The detection unit 14 according to the first embodiment detects a two-dimensional moire image, while the detection units 46 and 47 according to the second embodiment split light diffracted by the first diffraction grating 21 into diffracted light beams along two optical paths in the X- and Y-directions, and detect the diffracted light beams in the X- and Y-directions as a one-dimensional moire image. FIG. 9 is a schematic view showing an optical system 10 which splits light diffracted by the first diffraction grating 21 of the mesa 2 into diffracted light beams along two optical paths. Light diffracted by the first diffraction grating 21 of the mesa 2 forms an intermediate image 40, and passes through a half mirror 41 of the optical system 10, thereby being split into diffracted light beams along two optical paths in the X- and Y-directions. The split diffracted light beams form images again upon passing through objective lenses 42 and 43, respectively. X and Y second diffraction gratings 44 and 45 are placed in the portions where images are formed, and diffracted light beams in the X- and Y-directions overlap the second diffraction gratings 44 and 45, respectively, to form one-dimensional moire images, respectively. The diffracted light beams in the X- and Y-directions, which form moire images, are detected by the X and Y detection units 46 and 47. Note that line-and-space patterns are used as the grating patterns of the X and Y second diffraction gratings 44 and 45.

Figure 10:
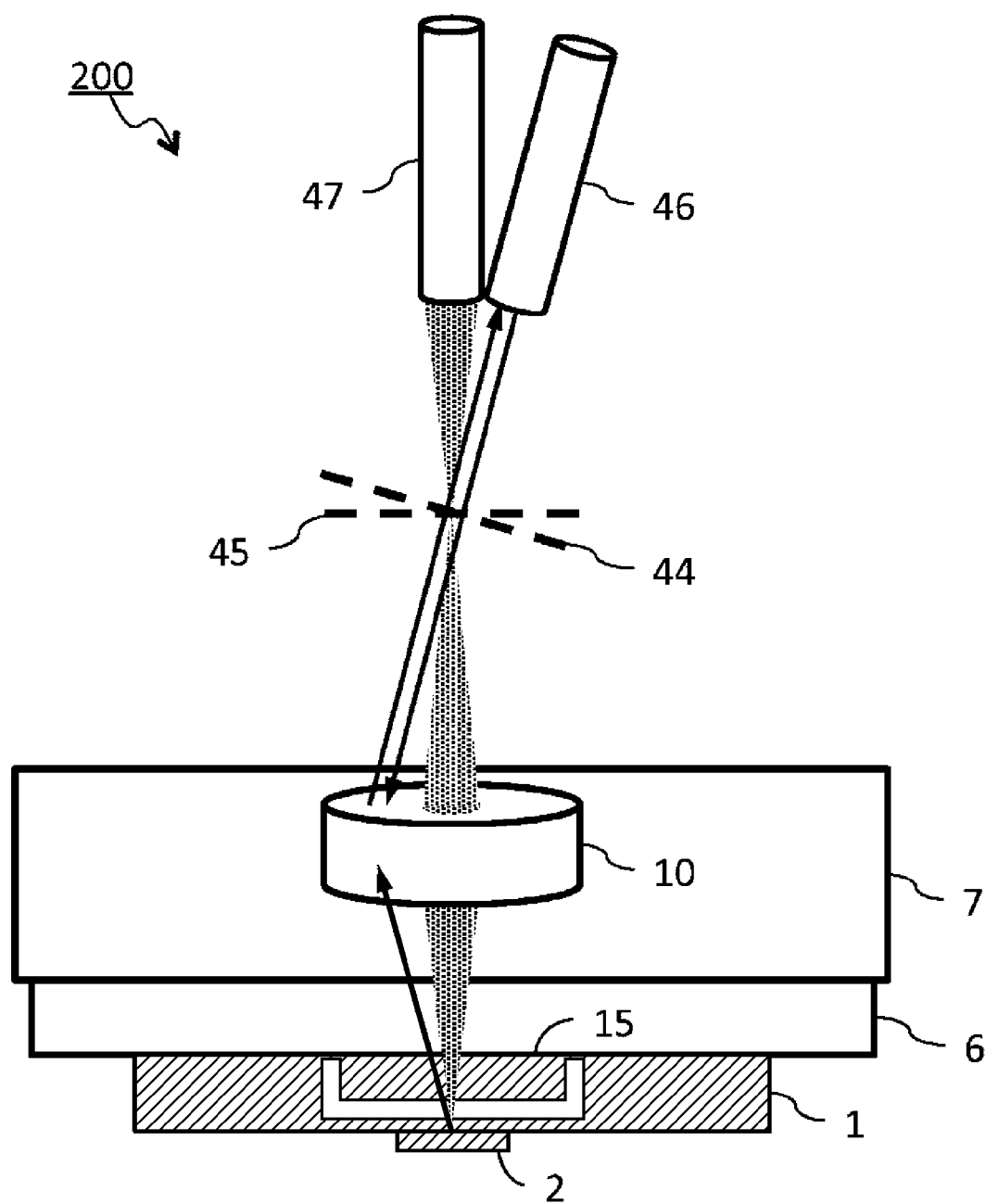
FIG. 10 is a view showing the imprint apparatus according to the second embodiment of the present invention.

Oblique illumination in which diffracted light is split into diffracted light beams along two optical paths in this way will be described using an imprint apparatus 200 that adopts the Littrow optical arrangement, in which the same angle and direction are set for illumination and reception of a principal ray. FIG. 10 is a view showing an imprint apparatus 200 that employs the Littrow optical arrangement according to the second embodiment. Each of the X and Y detection units 46 and 47 includes an illumination unit (not shown), and is designed to use the optical system 10 to irradiate the entire surface of the first diffraction grating 21 of the mesa 2 with light. Note that a staggered pattern is used as the grating pattern of the first diffraction grating 21 of the mesa 2.

When the illumination wavelength is set to 0.6 μm, and light is emitted by the X detection unit 46 at an angle corresponding to a numerical aperture (NA)=0.1, 0th-order light is diffracted by the first diffraction grating 21 of the mesa 2 at an angle corresponding to NA=0.1 in the X-direction with respect to the central portion of the pupil plane of the optical system 10. As in the first embodiment, because 0th-order light degrades the contrast of a moire image due to its very strong light intensity, it desirably is cut off. In the second embodiment, 0th-order light is cut off by setting the stop on the pupil plane of the optical system 10 to have NA=0.07 or less. Also, 1st-order diffracted light is diffracted by the first diffraction grating 21 at angles corresponding to NA=0.03 and NA=0.17 in the X-direction, that is, the stop on the pupil plane of the optical system 10 is set to have NA=0.07 or less, so the 1st-order diffracted light with NA=0.17 is cut off, while the 1st-order diffracted light with NA=0.03 passes through the optical system 10. That is, referring to FIG. 8 which shows the light intensity distribution formed on the pupil plane of the optical system 10 in vertical illumination, if light enters the optical system 10 obliquely in the X-direction, only two, right or left 1st-order diffracted light beams of four 1st-order diffracted light beams 31 shown in FIG. 8 pass through the optical system 10. When the angle of light emitted by the Y detection unit 47 is set to correspond to NA=0.1 as well, the same result is obtained, excluding the property which is different between the X- and Y-directions. If light enters the optical system 10 obliquely in the Y-direction, only two, upper or lower 1st-order diffracted light beams of the four 1st-order diffracted light beams 31 shown in FIG. 8 pass through the optical system 10.

Two 1st-order diffracted light beams in the X-direction, which are diffracted by the first diffraction grating 21 of the mesa 2 and pass through the optical system 10, overlap the X second diffraction grating 44 to form a one-dimensional moire image. Similarly, two 1st-order diffracted light beams in the Y-direction, which are diffracted by the first diffraction grating 21 of the mesa 2 and pass through the optical system 10, overlap the Y second diffraction grating 45 to form a one-dimensional moire image. As in the first embodiment, the moire images in the X- and Y-directions have a period of 1.6 mm and are detected by the X and Y detection units 46 and 47. Note that a calculation unit 15 and a deforming unit 16 in the second embodiment are the same as in the first embodiment, and a description thereof will not be given.

In the second embodiment, one-dimensional moire images in the X- and Y-directions are formed by superposing the first diffraction grating 21 of the mesa 2 (mold 1), and the X and Y second diffraction gratings 44 and 45 of the imprint apparatus 200. Position deviations in the pattern region of the mold 1 in the X- and Y-directions can be independently calculated by detecting these one-dimensional moire images by the X and Y detection units 46 and 47.

Third Embodiment

Figure 11:
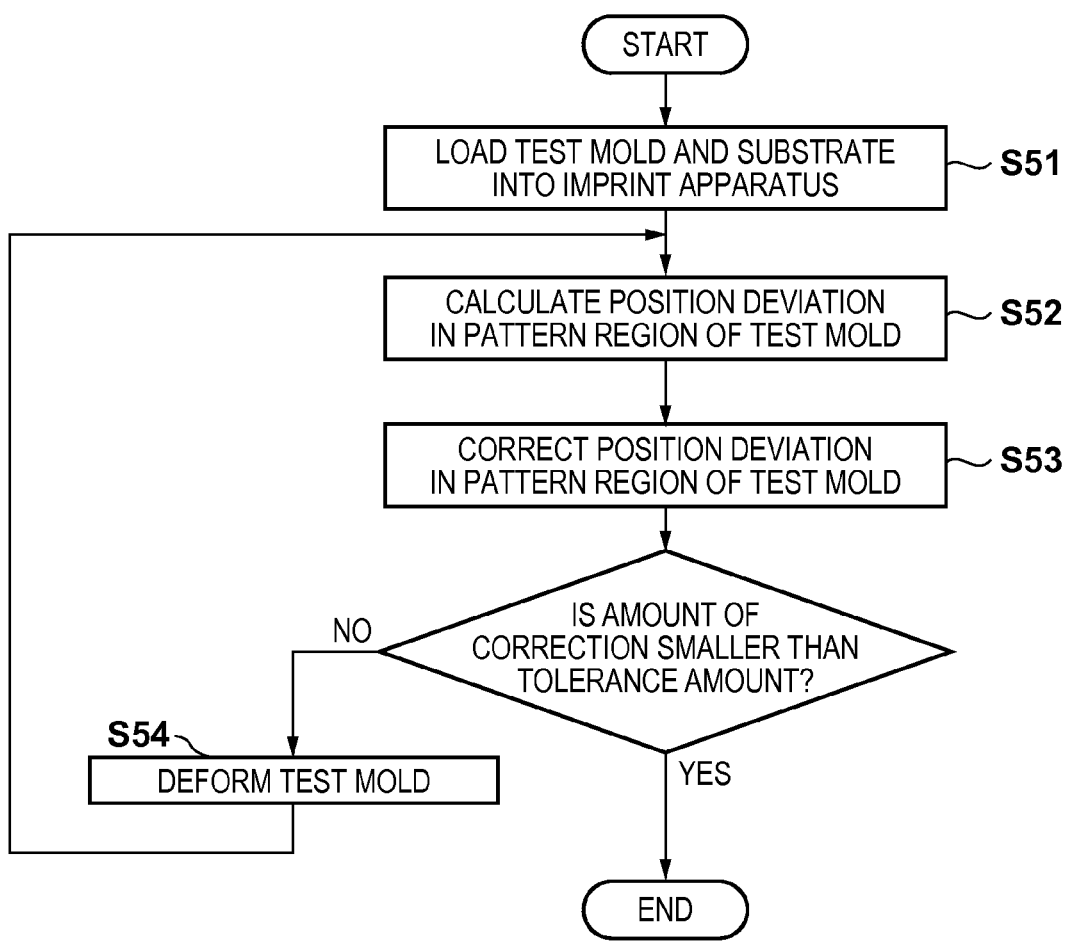
FIG. 11 is a flowchart for explaining a method of obtaining the amount of correction of a position deviation in a pattern region in an imprint apparatus according to the third embodiment of the present invention.

Imprint apparatuses, each of which detects a moire image formed by the second diffraction grating 12 and the first diffraction grating 21 of the mesa 2 (mold 1), and calculates a position deviation in the pattern region of the mesa 2 using the detected moire image, have been described in the first and second embodiments. A method of obtaining, in advance, the amount of correction of a position deviation in the pattern region using a test mold in either of the imprint apparatuses according to the first and second embodiments will be described with reference to FIG. 11 in the third embodiment. As long as the amount of correction of a position deviation in the pattern region is obtained in advance, it can be used to correct the position deviation if a mold 1 having nonlinear distortion nearly equivalent to that of the test mold is used. Note that the test mold includes a mesa 2, which includes a first diffraction grating 21, as in the first embodiment.

In step S51, a test mold and a substrate 3 are loaded into the imprint apparatus. In step S52, the test mold is pressed against the substrate 3, a moire image formed by the first diffraction grating 21 and a second diffraction grating 12 is detected, and a position deviation in the pattern region of the test mold is calculated using the detected moire image, as in the first embodiment. Note that step S52 may be repeated upon changing the position of the substrate 3 against which the test mold is pressed.

In step S53, the calculated position deviation in the pattern region of the test mold is corrected by a deforming unit 16. At this time, the amount of correction of the position deviation in the pattern region of the test mold must be smaller than a tolerance amount. The tolerance amount means the maximum value of the amount of correction that can be performed by the deforming unit 16. If, for example, an actuator is used as the deforming unit 16, its amount of actuation has a mechanical limit, so the limit amount of actuation is equal to the tolerance amount. Also, if the amount of actuation of the actuator is set equal to or larger than a given threshold, the position deviation in the pattern region can be corrected, but a position deviation often occurs in alignment marks 24 formed on the peripheral portion surrounding the pattern region. At this time, the threshold is equal to the tolerance amount.

If the amount of correction is smaller than the tolerance amount, the operation of obtaining the amount of correction using the test mold ends. On the other hand, if the amount of correction is larger than the tolerance amount, the process advances to the next step (step S54). In step S54, the test mold is deformed by changing the pressure in an air chamber 9 by a pressure control unit 13, or irradiating the pattern region with infrared rays by an irradiation unit 17. When the pattern of the test mold has deformed, the process returns to step S52, in which a position deviation in the pattern region of the test mold is calculated, and the correction operation in step S53 is repeated.

In the third embodiment, the amount of correction of a position deviation in the pattern region is obtained in advance using a test mold. In this manner, as long as the amount of correction of a position deviation in the pattern region is obtained in advance using a test mold, it can be used to correct the position deviation if a mold 1 having nonlinear distortion nearly equivalent to that of the test mold is used. That is, since a step of detecting a moire image for each mold, and calculating a position deviation in the pattern region can be omitted, the throughput of the imprint apparatus 100 improves.

Fourth Embodiment

Figure 12:
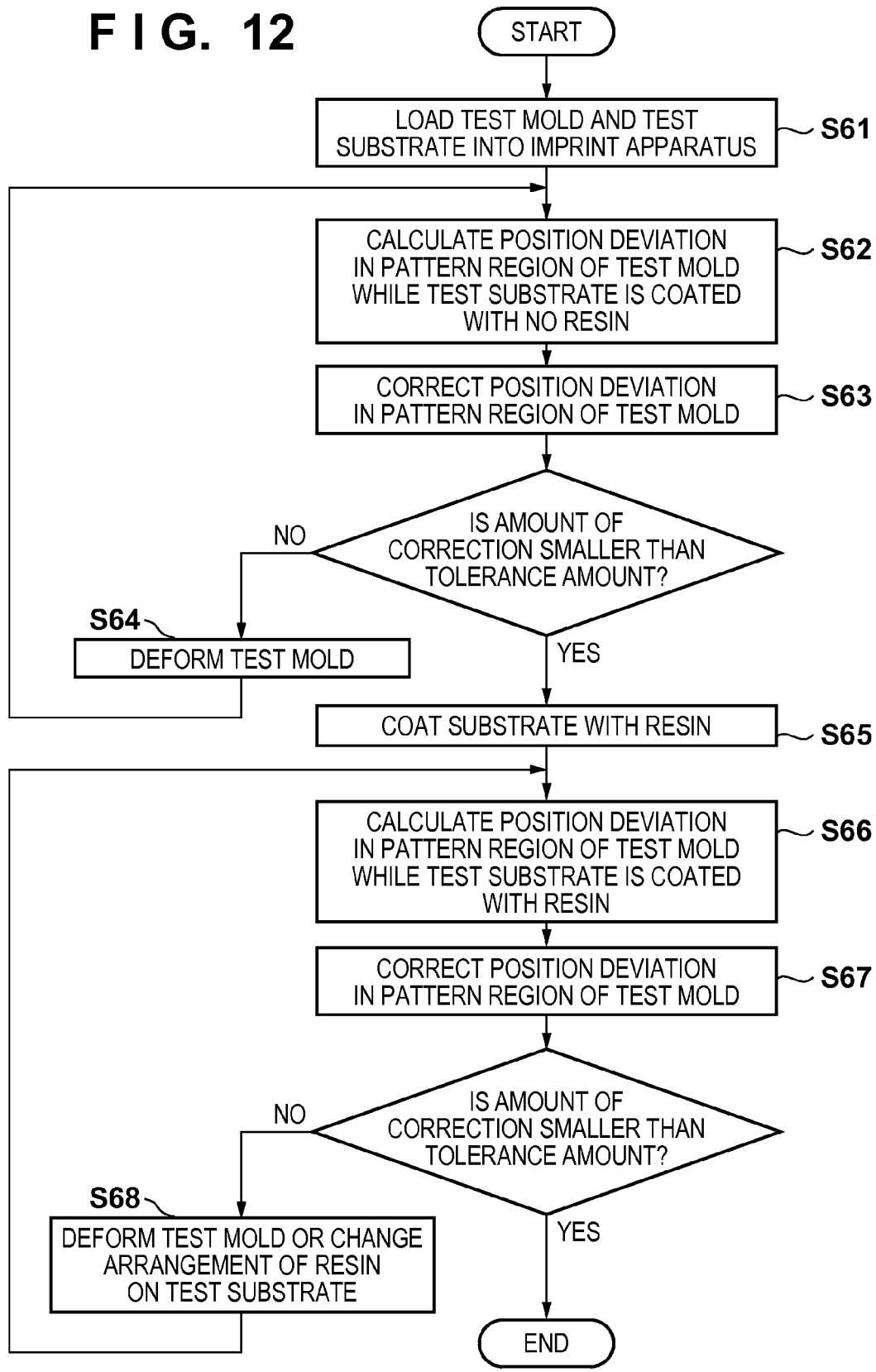
FIG. 12 is a flowchart for explaining a method of obtaining the amount of correction of a position deviation in a pattern region in an imprint apparatus according to the fourth embodiment of the present invention.

A method of obtaining, in advance, the amount of correction of a position deviation in the pattern region using a test mold has been described in the third embodiment. In the fourth embodiment, using not only a test mold but also a test substrate, the amount of correction of a position deviation in the pattern region is obtained while the test substrate is coated with no resin, and then the amount of correction of a position deviation in the pattern region is obtained while the test substrate is coated with a resin. A method of obtaining, in advance, the amount of correction of a position deviation in the pattern region according to the fourth embodiment will be described with reference to FIG. 12. As long as the amount of correction of a position deviation in the pattern region is obtained in advance, it can be used to correct the position deviation if a mold 1 having nonlinear distortion nearly equivalent to that of the test mold is used, as in the third embodiment. Also, by obtaining, using a test substrate, the amounts of correction of position deviations in the pattern region while the test substrate is coated with a resin and while it is coated with no resin, the amount of deformation of the mold due to a capillary force generated as the pattern is filled with a resin can be obtained. Note that the test mold includes a mesa 2, which includes a first diffraction grating 21, as in the first embodiment.

In step S61, a test mold and a test substrate are loaded into the imprint apparatus. In step S62, the test mold is pressed against the test substrate while it is coated with no resin, and a position deviation in the pattern region of the test mold is calculated using a moire image formed by the first diffraction grating 21 and a second diffraction grating 12, as in the first embodiment. Note that step S62 may be repeated upon changing the position of the substrate against which test mold is pressed.

In step S63, the calculated position deviation in the pattern region of the test mold is corrected by a deforming unit 16. At this time, the amount of correction of the position deviation in the pattern region of the test mold must be smaller than a tolerance amount. If the amount of correction is larger than the tolerance amount, the process advances to step S64. In step S64, the test mold is deformed by changing the pressure in an air chamber 9 by a pressure control unit 13, or irradiating the pattern region with infrared rays by an irradiation unit 17. When the pattern of the test mold has deformed, the process returns to step S62, in which a position deviation in the pattern region of the test mold is calculated, and the correction operation in step S63 is repeated. On the other hand, if the amount of correction is smaller than the tolerance amount, the process advances to step S65.

In step S65, the test substrate is coated with a resin. In step S66, the test mold is pressed against the test substrate while it is coated with a resin, a moire image formed by the first diffraction grating 21 and second diffraction grating 12 is detected, and a position deviation in the pattern region of the test mold is calculated using the detected moire image. Note that step S66 may be repeated upon changing the position of a substrate 3 against which the test mold is pressed.

In step S67, the calculated position deviation in the pattern region of the test mold is corrected by the deforming unit 16. At this time, the amount of correction of the position deviation in the pattern region of the test mold must be smaller than a tolerance amount. If the amount of correction is smaller than the tolerance amount, the operation of obtaining the amount of correction using the test mold ends. On the other hand, if the amount of correction is larger than the tolerance amount, the process advances to step S68. In step S68, the test mold is deformed by changing the pressure in the air chamber 9 by the pressure control unit 13, or irradiating the pattern region with infrared rays by the irradiation unit 17. Note that when position deviations in the pattern region while the test substrate is coated with a resin and while it is coated with no resin occur due to a capillary force generated as the pattern is filled with a resin, the arrangement of a resin coated on the test substrate may be changed. When the test mold has deformed, or the arrangement of a resin coated on the test substrate has changed, the process returns to step S66, in which a position deviation in the pattern region of the test mold is calculated, and the correction operation in step S67 is repeated.

In the fourth embodiment, using a test mold and a test substrate, the amount of correction of a position deviation in the pattern region is obtained while the test substrate is coated with no resin, and then the amount of correction of a position deviation in the pattern region is obtained while the test substrate is coated with a resin. In this manner, as long as the amount of correction of a position deviation in the pattern region is obtained in advance, it can be used to correct the position deviation if a mold having nonlinear distortion nearly equivalent to that of the test mold is used, as in the third embodiment. Also, by obtaining, using a test substrate, the amounts of correction of position deviations in the pattern region while the test substrate is coated with a resin and while it is coated with no resin, the amount of deformation of the mold due to a capillary force generated as the pattern is filled with a resin can be obtained.

<Embodiment of Method of Manufacturing Article>

A method of manufacturing an article according to an embodiment of the present invention is suitable for manufacturing various articles including a microdevice such as a semiconductor device and an element having a microstructure. This method includes a step of forming a pattern on a resin, coated on a substrate, using the above-mentioned imprint apparatus (a step of performing an imprint process on a substrate), and a step of processing the substrate having the pattern formed on it in the forming step. This method also includes subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-057876 filed on Mar. 14, 2012, which is hereby incorporated by reference herein in its entirety.

The invention claimed is:

1. An imprint method for an imprint apparatus which transfers a device pattern onto a substrate by using a mold,
   the mold including a first surface and a second surface opposite to the first surface, the first surface having a pattern region and a peripheral portion which surrounds the pattern region, the pattern region including convex portions and concave portions configuring the device pattern to be transferred onto the substrate, the peripheral portion including alignment marks to be aligned to marks on the substrate,
   the method comprising steps of:
     detecting an image formed by light from a first measurement pattern of the mold and a second measurement pattern provided in the imprint apparatus;
     calculating a distortion of the pattern region based on the image detected in the step of detecting; and
     deforming, based on the distortion calculated in the step of calculating, the mold by applying a force to the mold so as to reduce the distortion,
   wherein the first measurement pattern is formed between the second surface and lower surfaces of the convex portions, or on the second surface, such that the first measurement pattern includes a portion overlapping with the convex portions and the concave portions of the device pattern when viewed from a direction orthogonal to the first surface.

2. The method according to claim 1, wherein
the first measurement pattern includes a first diffraction grating,
the second measurement pattern includes a second diffraction grating which has a grating pitch different from a grating pitch of the first diffraction grating, and receives light from the first diffraction grating, and
the image includes interference fringes formed by light from the first diffraction grating and the second diffraction grating.

3. The method according to claim 2, wherein the second diffraction grating is placed at a position optically conjugate to the first diffraction grating.

4. The method according to claim 1, wherein
the first measurement pattern includes a first diffraction grating,
the second measurement pattern includes a plurality of second diffraction gratings each having different grating pitch from a grating pitch of the first diffraction grating,
in the step of detecting, a plurality of interference fringes formed by light from each of the plurality of second diffraction gratings and the first diffraction grating are detected, and
in the step of calculating, the distortion is calculated based on the plurality of interference fringes detected in the step of detecting.

5. The method according to claim 1, wherein the first measurement pattern is formed by one of a step and a metal film.

6. The method according to claim 1, wherein the first measurement pattern is formed between the first surface and the second surface by ion implantation.

7. The method according to claim 1, the method further comprising steps of measuring a position deviation between the alignment marks of the mold and the marks on the substrate, and aligning the mold and the substrate based on the position deviation measured in the step of measuring.

8. The method according to claim 1, wherein in the step of detecting, the image is detected in a state in which the mold is pressed against the substrate.

9. The method according to claim 1, wherein
the mold includes a mesa portion having a rectangular shape,
the alignment marks includes at least four alignment marks arranged at the four corners of the mesa portion, and
the device pattern to be transferred onto the substrate is arranged inside the at least four alignment marks.

10. The method according to claim 1, wherein a test mold is used in the step of detecting, and a mold different from the test mold is used in the step of deforming.

11. The method according to claim 1, wherein the first measurement pattern is formed so as not to overlap with the alignment marks in the peripheral portion when viewed from the direction orthogonal to the first surface.

12. A method of manufacturing an article, the method characterized by comprising:
performing forming a pattern of a resin on a substrate using an imprint method for an imprint apparatus which transfers a device pattern onto a substrate by using a mold; and
processing the substrate, on which the forming has been performed, to manufacture the article,
wherein the mold includes a first surface and a second surface opposite to the first surface, the first surface having a pattern region and a peripheral portion which surrounds the pattern region, the pattern region including convex portions and concave portions configuring the device pattern to be transferred onto the substrate, the peripheral portion including alignment marks to be aligned to marks on the substrate,
wherein the method comprises steps of:
detecting an image formed by light from a first measurement pattern of the mold and a second measurement pattern provided in the imprint apparatus;
calculating a distortion of the pattern region based on the image detected in the step of detecting; and
deforming, based on the distortion calculated in the step of calculating, the mold by applying a force to the mold so as to reduce the distortion,
wherein the first measurement pattern is formed between the second surface and lower surfaces of the convex portions, or on the second surface, such that the first measurement pattern includes a portion overlapping with the convex portions and the concave portions of the device pattern when viewed from a direction orthogonal to the first surface.

* * * * *